United States Patent [19]

Yamaguchi et al.

[11] Patent Number: 4,536,745
[45] Date of Patent: Aug. 20, 1985

[54] SAMPLING FREQUENCY CONVERSION DEVICE

[75] Inventors: Hirohisa Yamaguchi, Tanashi; Kazuo Yamada, Tokyo; Tsutomu Miyasato, Tanashi, all of Japan

[73] Assignee: Kokusai Denshin Denwa Co., Ltd., Tokyo, Japan

[21] Appl. No.: 503,508

[22] Filed: Jun. 13, 1983

[30] Foreign Application Priority Data

Jun. 15, 1982 [JP] Japan .................. 57-101367

[51] Int. Cl.³ .............................................. H04L 3/00
[52] U.S. Cl. ............................................ 340/347 DD
[58] Field of Search ..... 340/347 R, 347 DD, 347 SH; 364/724, 726

[56] References Cited

U.S. PATENT DOCUMENTS

| | | | |
|---|---|---|---|
| 4,002,981 | 1/1977 | Eggermont | 340/347 DD |
| 4,109,110 | 8/1978 | Gingell | 340/347 DD |
| 4,188,583 | 2/1980 | McCurdy | 340/347 SH |
| 4,209,771 | 6/1980 | Miyata et al. | 340/347 DD |
| 4,393,272 | 7/1983 | Itakura et al. | 364/724 X |

*Primary Examiner*—Vit W. Miska
*Attorney, Agent, or Firm*—Armstrong, Nikaido, Marmelstein & Kubovcik

[57] ABSTRACT

An input digital signal with $M(=5)$ samples/second is converted to an output signal with $N(=6)$ samples/second with $n(=9)$ quantization bits. The device comprises parallel shift registers each having bit length $P+n(P=11)$ for accepting an input signal with bit length n; an address converter for providing the continuous P bits in input signals from each of said parallel shift registers for every shift operation of said shift registers; N groups of ROMs (read only memory) storing the predetermined value in each address which is designated by output of said address converter; a shift register adder for accumulating output of said ROMs with shift operation; and an output gate coupled with output of said shift register adder for providing a converted output signal.

2 Claims, 8 Drawing Figures

SAMPLING FREQUENCY CONVERSION DEVICE

BACKGROUND OF THE INVENTION

The present invention relates to a sampling frequency conversion circuit which converts an input digital signal series with the first sampling frequency M (samples/period(T)) and n quantization bits, to an output digital signal series with N (samples/period(T)) and n' quantization bits, where N is an interger different from the interger M. The present invention relates in particular to such a circuit which converts with high conversion speed, and requests small capacity of memory for conversion calculation.

First, a prior conversion process is described. When an input signal series with M (samples/period(T)) is converted to an output signal series with N samples/period(T), an intermediate signal series with L samples/period(T) is provided, where L is the common multiple of the integers M and N, and then, an output sampling signal is derived from said intermediate signal with L samples/period(T) for every predetermined duration. That process is described in detail in accordance with FIG. 1, where it is supposed that an input signal frequency is 5 samples/period, and an output signal frequency is 6 samples/period, and each sample has n=9 quantization bits.

FIG. 1(a) shows an input signal series which has 5 samples ($T_{n-5}$ - - - $T_{n-1}$, $T_{n-4}$ - - - $T_0$, et al.) in a period (T), and FIG. 1(d) shows an output signal series which has 6 samples ($W_{n-6}$ - - - $W_{n-1}$, $W_{n-5}$ - - - $W_0$, et al.) in said period (T). In order to obtain the output signal series of FIG. 1(d), the signal series of FIG. 1(b) which has the input signal series of FIG. 1(a) and five ((30/5)−1=5) samples with amplitude zero inserted between each input samples, is obtained. Then, the intermediate signal series of FIG. 1(b) is processed by a low-pass filter with the bandwidth $\pi$/(number of inserted zeros, plus one)=$\pi$/6 so that said zero samples in FIG. 1(b) are converted to interpolated samples between each input samples. The signal of FIG. 1(c) is the output of said process of interpolation. The signal series of FIG. 1(c) has 30 samples/period(T). The output signal series of FIG. 1(d) is obtained by extracting a pulse in FIG. 1(c) for every 5 (=30/6) pulses. Thus, the signal of FIG. 1(d) has 6 samples/period(T).

Said interpolation process, or a low-pass filtering process is accomplished by using a finite impulse response filter (FIR), or a transversal filter, which satisfies a linear phase condition.

FIG. 2 is a block diagram of a conventional transversal filter, in which the reference numeral 1 is an input terminal, 2 is an output terminal, 3 is a shift register with delay elements $3_1$ through $3_{61}$ each holding one sample value, $4_1$ through $4_{61}$ are multiplicators with multipliers $h_{-30}$ through $h_{30}$, respectively, and 5 is an adder for providing the sum of the outputs of the multiplicators $4_1$ through $4_{61}$. The transversal filter of FIG. 2 has 61 taps, which may be, however, another value, since the number of taps is selected according to the desired accuracy or error of an output signal. When an input signal of FIG. 1(b) is applied to the input terminal 1 of FIG. 2, an output signal of FIG. 1(c) is obtained at the output terminal 2 of FIG. 2.

In FIG. 2, the following equation (1) is satisfied where $x_k$ is the value of each of the input samples, $z_k$ is the value of each of the output samples, and $h_m$ is a multiplier of each of the multiplicators.

$$W_k = \sum_{m=-30}^{+30} h_m x_{k-m} \quad (1)$$

As apparent from the equation (1), the calculation of 61 multiplications and 60 additions is necessary for obtaining each single output sample $W_k$. That amount of calculation is extravagant, and therefore, the transversal filter of FIG. 2 is not suitable in the field which requests high speed interpolation calculation, like the field of a picture information processing.

In order to solve the above problem, the following solution may be possible. It should be noted in FIG. 1 that no calculation is necessary for an output sample which is not extracted, and for input sample with the value zero. For instance, the output sample $W_n$ in FIG. 1(d) is obtained only with 11 input samples $x_{-5}$ through $x_5$, and 11 multipliers ($h_0$, $h_{\pm 6}$, $h_{\pm 12}$, $h_{\pm 18}$, $h_{\pm 24}$, and $h_{\pm 30}$). The output sample $W_n$ is, in fact, the same as the input sample $x_n$, and therefore, no calculation is necessary for obtaining the output sample $W_n$. However, for the sake of the simplicity of the explanation, the calculation for obtaining the output sample $W_n$ is supposed to be accomplished in the above explanation. FIG. 1(e) shows the necessary multipliers for obtaining the output samples $W_n$ through $W_{n+6}$, and the following table 1 shows the same information.

TABLE 1

| Sub-filter | Coefficient $h_m$ (value of m is shown) | Number of taps |
|---|---|---|
| 1 | −30, −24, −18, −12, −6, 0, 6, 12, 18, 24, 30 | 11 |
| 2 | −29, −23, −17, −11, −5, 1, 7, 13, 19, 25, | 10 |
| 3 | −28, −22, −16, −10, −4, 2, 8, 14, 20, 26 | 10 |
| 4 | −27, −21, −15, −9, −3, 3, 9, 15, 21, 27 | 10 |
| 5 | −26, −20, −14, −8, −2, 4, 10, 16, 22, 28 | 10 |
| 6 | −25, −19, −13, −7, −1, 5, 11, 17, 23, 29 | 10 |

It should be appreciated in FIG. 1(e) and the table 1 that the multiplier of the interpolation filter has the period of 6 samples. Due to the presence of the periodicity, 6 (=L/M=30/5=$K_m$) sub-filters which have only 10 or 11 taps and are used recursively, may replace the interpolation filter of FIG. 2 which has 61 taps, for providing an output signal with N samples/period(T) from an input signal series with M samples/period(T).

FIG. 3 is another prior art which considers the above analysis. In FIG. 3, the shift register 3 has 11 taps, and the coefficient or the tap coefficient $6_1$ through $6_{11}$ of the multiplicators $6_1$ through $6_{11}$ is variable. Each time a signal of FIG. 1(a) is applied to the input terminal 1, a set of coefficients for the designated sub-filter as shown in the table 1 are provided to the multiplicators $6_1$ through $6_{11}$. And, said set of coefficients of the multiplicators $6_1$ through $6_{11}$ are selected recursively for each input signal. Then, an output signal is provided at the output terminal 6. In case of FIG. 3, since the speed of the output signal series is the same as that of the input signal series, the output signal is temporarily stored in a memory, which is read out with the desired speed (6 samples/period(T) in this case).

However, the embodiment of FIG. 3 still has the disadvantage that the operating speed is not fast enough, since the amount of calculation is 11 multiplications and 10 additions.

In order to solve the above problems a ROM which stores the result of the calculation has been used. The filter process in a sub-filter which is composed according to FIG. 1 and the table 1 is similar to the equation (1), and is shown below.

$$z_k = \sum_{m=1}^{11} h'_m x_{k-m} \quad (2)$$

Said equation (2) is changed to the equation (4) when a sampled value $x_k$ is a binary value as shown in the equation (3);

$$x_k = \sum_{i=0}^{n-1} a_i^{(k)} 2^i \quad a_i^{(k)} = 0 \text{ or } 1 \quad (3)$$

$$z_k = \sum_{i=0}^{n-1} 2^i \sum_{m=1}^{11} a_i^{(k-m)} h'_m \quad (4)$$

Accordingly, the ROM stores the value $$\sum_{m=1}^{11} a_i^{(k-m)} h'_m$$

at the address ($a_i^{(k-m)}$; $1 \leq m \leq 11$), and the output of said ROM is applied to the shift register which performs the multiplication with $2^i$ and the addition. Said addition is performed $(n-1)$ times, that is to say, when $n=9$ that addition is performed 8 times.

By the way, the necessary capacity of that ROM (read only memory) is shown by the equation (5);

$$2^{(\text{number of taps of a sub-filter})} \times C \times n \quad (5)$$

where C is a number of bits for expressing the coefficients of a filter. When C=9, the capacity of a ROM is $(2^{11} \times 9 \times 9)$ bits for each sub-filter. Since 6 sub-filters are used, the total capacity of the ROM is about $2^{20}$ bits. And, the number of the necessary process is $(n-1)=8$ times, in which each process includes the reading out the ROM and the addition. Said number $(=8)$ may be reduced to $n=4$, if a parallel calculation is accomplished. If we desire to perform the high speed calculation, a simultaneous calculation which performs the calculation for a plurality of bit planes simultaneously must be performed. For instance, when the number of taps is 11, n=9 and C=9, then, the number of the necessary addresses of the ROM is $2^{99}$ which relates to the total number of bits $(=99(11 \times 9))$, and the number of the total bits of the ROM is even $9 \times 2^{99}$.

It should be appreciated that said number $9 \times 2^{99}$ is extravagant. Therefore, an improved calculation which is high in speed, and uses less capacity of memory has been desired.

SUMMARY OF THE INVENTION

It is an object, therefore, of the present invention to overcome the disadvantages and limitations of a prior sampling frequency conversion circuit by providing a new and improved sampling frequency conversion circuit.

It is also an object of the present invention to provide a sampling frequency conversion circuit which is high in operational speed, and uses less memory capacity of a ROM.

The above and other objects are attained by a sampling frequency conversion circuit for converting an input digital signal with a sampling frequency (M samples/second) and each sample having n quantization bits, to an output digital signal with sampling frequency (N samples/second) and each sample having n quantization bits, where M and N are prime numbers, comprising (a) parallel shift registers each having bit length P+n, where P is an odd number equal to or larger than M, for accepting an input signal which has n bits, according to a timing of an input signal; (b) an address converter for providing P bits of output signal for each of said parallel shift registers for every shift operation of said shift registers; (c) N groups of ROMs storing $$\sum_{m=1}^{P} a_i^{(k-m)} h'_m \quad (1 \leq i \leq N)$$

at an address designated by the output of said address converter, each group of said ROMs having $[n/N]+1$ number of ROMs, where $h_m$ is a coefficient of a filter, $a_i$ is a possible combination of addresses provided by P bits, and [ ] is a Gauss's symbol; (d) a shift register adder with the bit length 2n for providing an accumulation of the output of said ROMs with shift operation; and (e) an output gate coupled with an output of said shift register adder for providing a converted output digital signal.

BRIEF DESCRIPTION OF THE DRAWINGS

The foregoing and other objects, features, and attendant advantages of the present invention will be appreciated as the same become better understood by means of the following description and accompanying drawings wherein.

DESCRIPTION OF THE PREFERRED EMBODIMENT

It is assumed in the following description that the input signal has the sampling frequency M=5 and each sample has n=9 bits, and the output signal has the sampling frequency N=6 and each sample has n=9 bits. Also, it is assumed that the transversal filter has 61 taps by 6 sub-filters, and each coefficient of the filter has 9 bits of information. Said assumption is taken merely for the sake of the simple understanding of the explanation.

Figure 4:
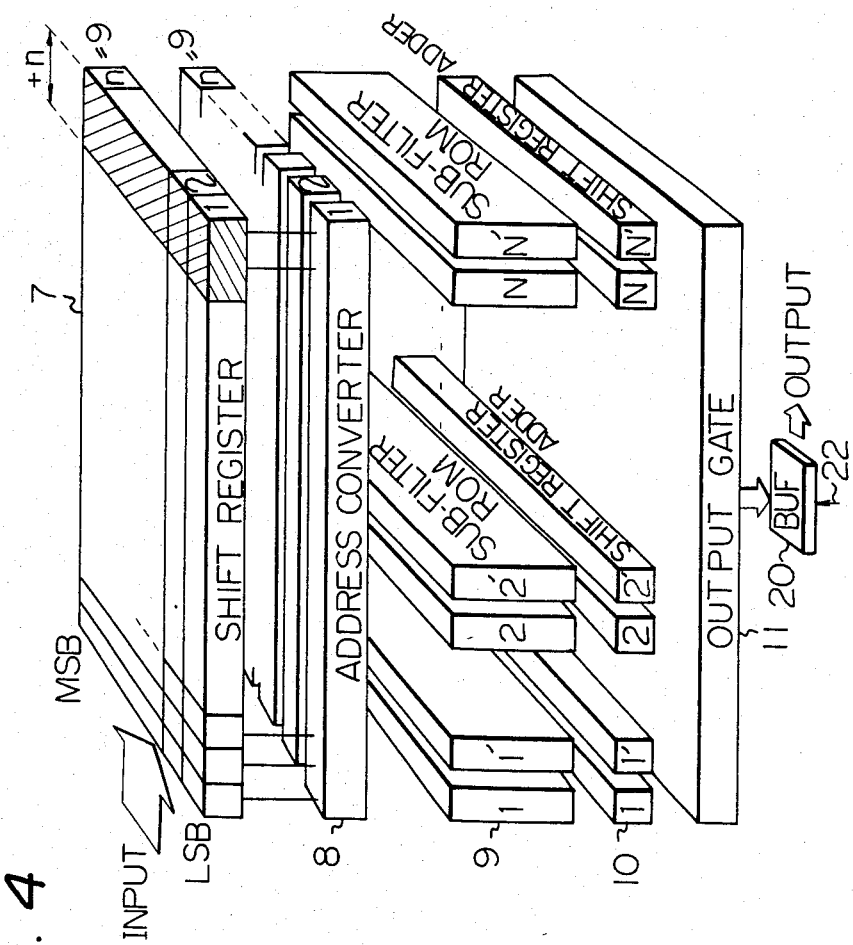
FIG. 4 shows the structure of the present sampling frequency conversion circuit.

FIG. 4 shows the structure of the sampling frequency conversion circuit according to the present invention. The device of FIG. 4 has the following five components.

(1) A shift register 7 with n(=9) parallel bits for accepting an input signal $x_k$;

(2) An address converter group 8 for converting the bit plane information of an input signal to the address of a ROM (read only memory);

(3) A sub-filter memory bank group 9;

(4) A combination 10 of an adder and a shift register; and (5) An output gets 11, and a buffer memory 20. Said sub-filter bank 9 and the adder/shift register 10 are doubled as shown in the drawing.

According to the embodiment of FIG. 4, the relationship between an input signal and a sub-filter is the same as that of the table 1, but the sub-filter of the present embodiment uses the bit plane process shown in the equation (4), instead of the process for every sample of a prior art. Thus, the operational speed is considerably improved as a sub-filter is accessed efficiently. According to the present embodiment, an output sample is obtained for each input timing.

In FIG. 4 and the equation (4), the value $$\sum_{m=1}^{11} a_l^{(k-m)} h'_m$$

is provided by sub-filter ROM's 9, then, the shift register adder 10 provides the multiplication and the addition $$\sum_{i=0}^{n-1} 2^i$$

to the output of the sub-filter ROM's 9. Further, it should be noted that $a_l^{(k-m)} = 0$ or 1.

When each sample has n=9 bits, there exists 9 bit planes. Those bit planes are designated as LSB (least significant bit) plane through an MSB (most significant bit) plane. When one of those bit planes is applied to a sub-filter one after another starting from an LSB plane, an addition is performed for the outputs of the sub-filters and thus an output sample is calculated in 9 input timings. Further, a single sub-filter is enough for the calculation of each bit plane, other sub-filters may be used for the calculation of other bit planes. Therefore, a parallel calculation can be accomplished. Further, the sub-filters 1 and 2 may operate with the same input signal, and therefore, those sub-filters may operate in parallel. Other sub-filters 3 through 6 operate when a new input sample is applied to the same.

In considering the above analysis, the present embodiment has the following structure.

Figure 5:
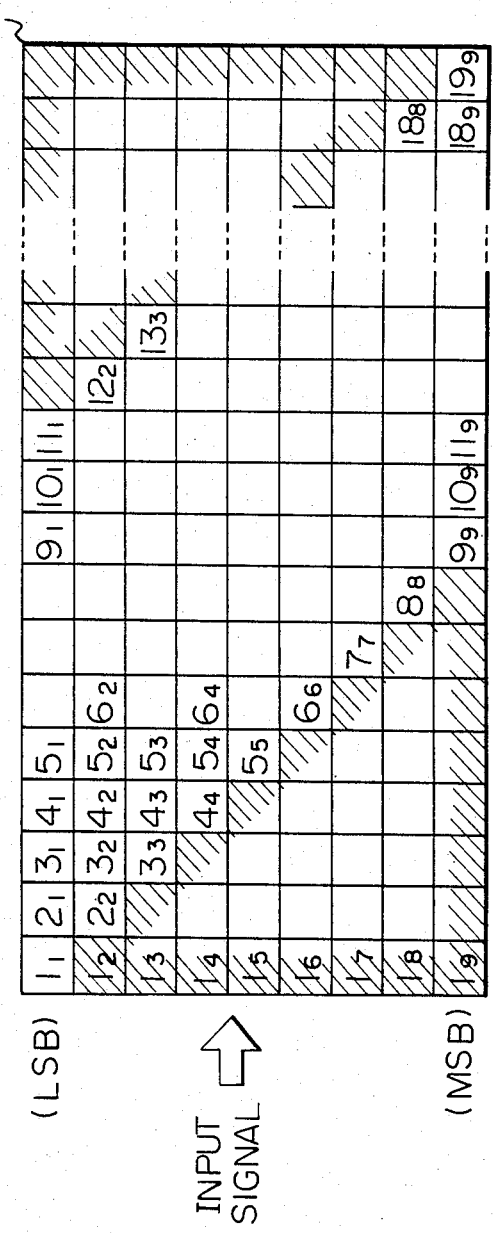
FIG. 5 shows the operation of the address converter according to the present invention.

First, a parallel shift register is logically divided as shown in FIG. 5, in which an input signal is applied to the shift register 7 from left side, and the content of the shift register 7 is shifted to the right side by one bit for every input timing. In FIG. 5, each cell shows a single bit, a capital numeral shows the X-coordinate, and the suffix shows the Y-coordinate which shows the sequence of the bit counting from the LSB bit.

Figure 1A:
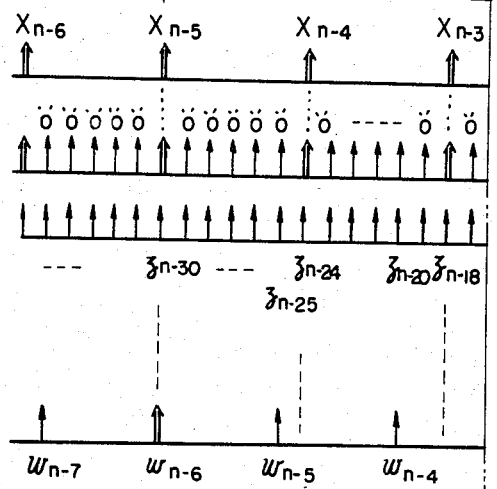
FIGS. 1A-1C are explanatory drawings for showing the theoretical principle of the sampling frequency conversion.
Figure 1B:
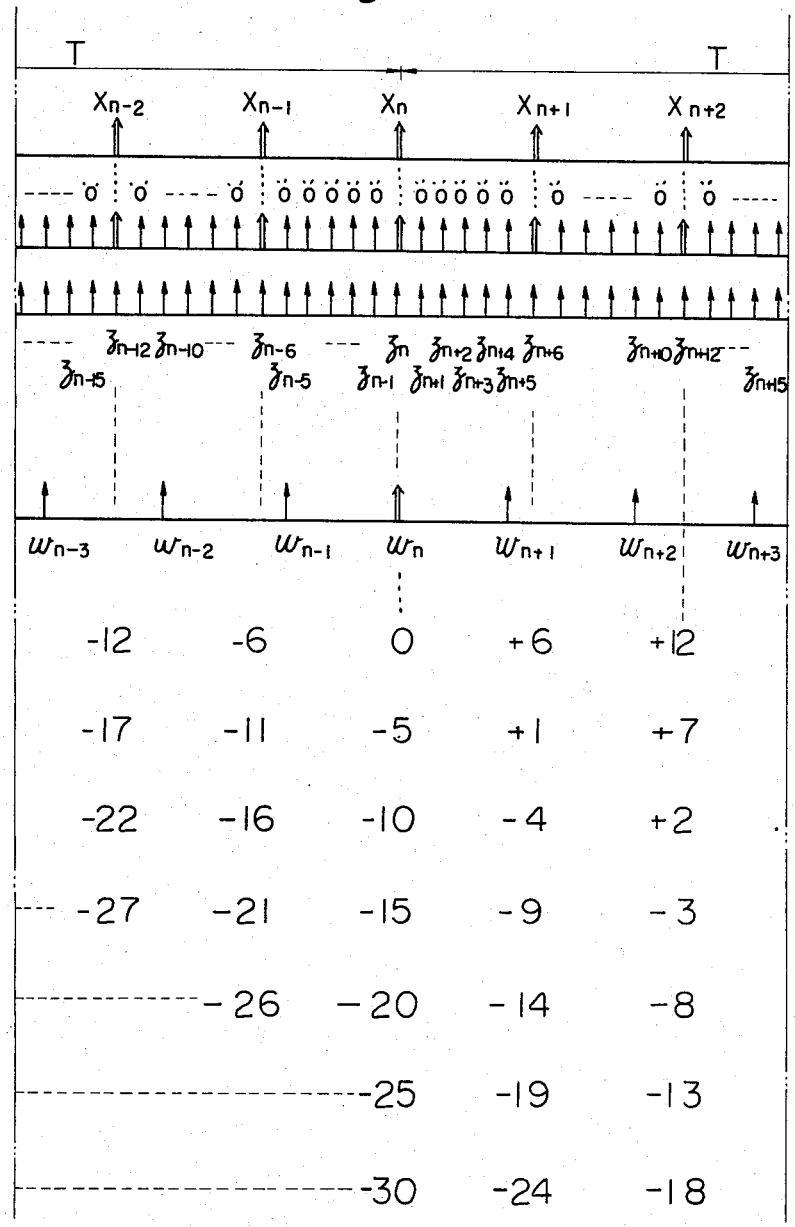
Figure 1C:
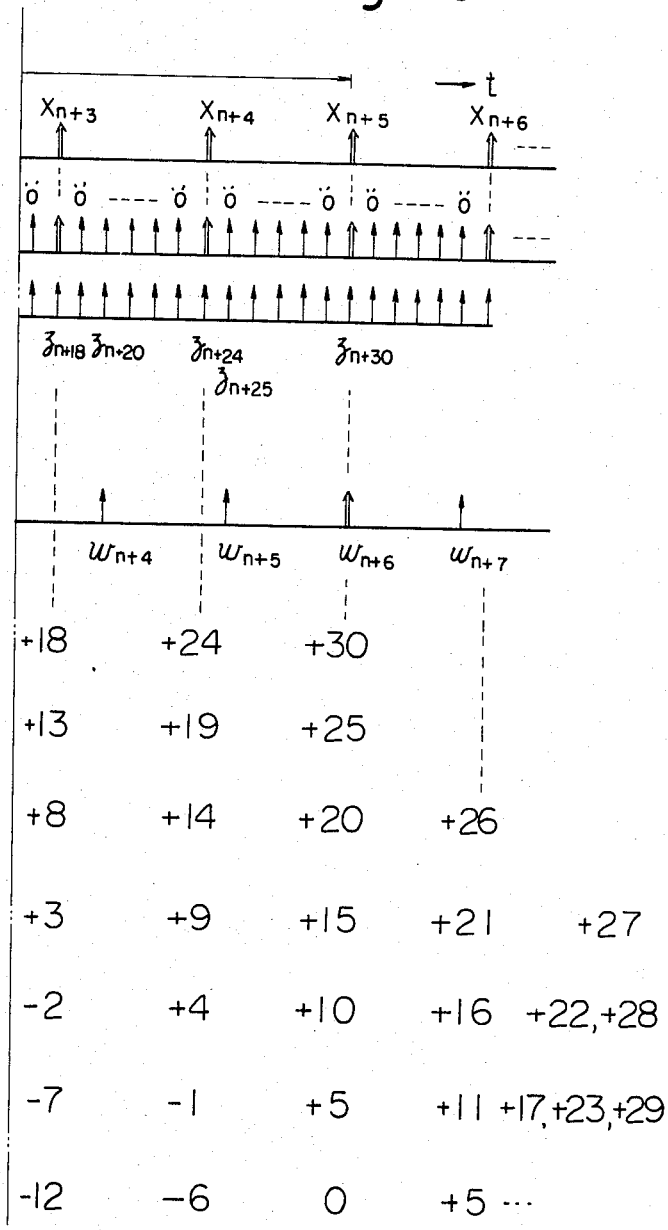
Figure 2:
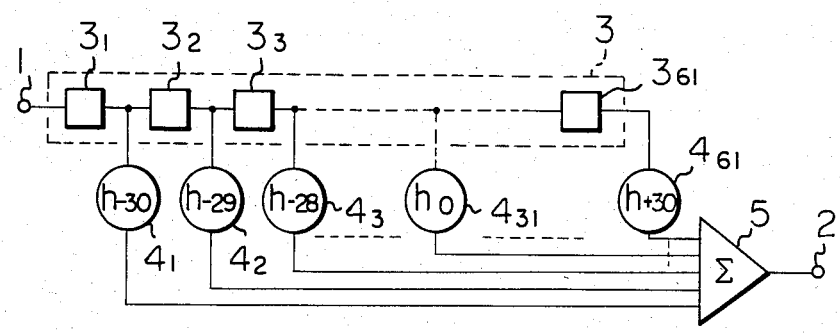
FIG. 2 shows a conventional transversal filter for the use of the sampling frequency conversion circuit.
Figure 3:
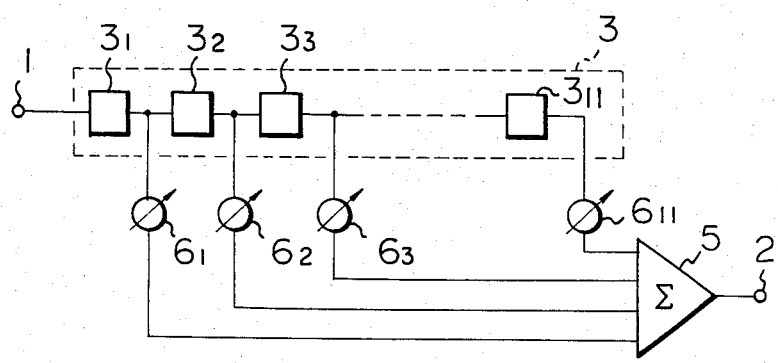
FIG. 3 is another configuration of a transversal filter for the use of the sampling frequency conversion circuit.

Assuming that 19 samples from $x_{n-5}$ to $x_{n+13}$ in FIG. 1 are applied to the present device, the first bit plane (LSB) with 11 samples $(x_{n+5},,,x_{n-5})$ are stored in the cells $1_1$ through $11_1$ in FIG. 5, and the second bit plane $(x_{n+6},,,x_{n-4})$ are stored in the cells $2_2$ through $12_2$. Similarly, the nine'th bit plane (MSB) with 11 bits $(x_{n+3},,,x_{n+13})$ are stored in the cells $9_9$ through $19_9$. Accordingly, the sub-filters 1 and 2 can operate with the content of the first bit plane ($1_1$ through $11_1$), and the sub-filter 3 can operate with the content of the second bit plane. Accordingly, the shaded area in FIG. 5 is not used, and only the portions $(1_1,,,11_1)$, $(2_2,,,12_2),,,(9_9,,,19_9)$ are used for designating the address of a ROM filter.

When an additional sample is applied to the device, all the samples in the device are shifted by one bit position in right direction, then, the second bit plane of $(x_{n+5},,,x_{n-5})$ is obtained at the cells $2_2$ through $12_2$. Therefore, the sub-filter 1 processes the second bit plane of $(x_{n+5}$ through $x_{n-5})$ with the address information provided by the cells ($2_2$ through $12_2$). Other processes are carried out similarly.

The access of the sub-filters is shown in the table 2, in which the symbol H and H' show sub-filters, and the connections of sub-filters or an operational mode of a sub-filter have 10 modes from (0) to (9). Further, it should be noted that sub-filters are doubled, and the reason of the double sub-filters is described later.

The process of each sample is completed during the one cycle of modes.

TABLE 2

(access Table of sub-filters)

| Bit plane # | Mode # | | | | |
|---|---|---|---|---|---|
| | (0) | (1) | (2) | (8) | (9) |
| 1 | $H_{1,2}$ | $H_3$ | $H_4$ | $H_5'$ | $H_6'$ |
| 2 | $H_6'$ | $H_{1,2}$ | $H_3$ | $H_4'$ | $H_5'$ |
| 3 | $H_5'$ | $H_6$ | $H_{1,2}$ | $H_3'$ | $H_4'$ |
| 4 | $H_4'$ | $H_5$ | $H_6'$ | $H_{1,2}'$ | $H_3'$ |
| 5 | $H_3'$ | $H_4$ | $H_5'$ | $H_6$ | $H_{1,2}'$ |
| 6 | $H_{1,2}'$ | $H_3$ | $H_4'$ | $H_5$ | $H_6$ |
| 7 | $H_6$ | $H_{1,2}$ | $H_3'$ | $H_4$ | $H_5$ |
| 8 | $H_5$ | $H_6$ | $H_{1,2}'$ | $H_3$ | $H_4$ |
| 9 | $H_4$ | $H_5$ | $H_6$ | $H_{1,2}$ | $H_3$ |

The address converter 8 couples each of the first bit plane to the nine'th bit planes to the desired sub-filter ROM according to the access table of the table 2.

Now, the configuration of a sub-filter is described. Since each sub-filter is addressed by bit planes with 11 bits, a sub-filter has $2^{11}$ number of addresses, and the content of a ROM is as follows;

$$\sum_{m=1}^{11} a_l^{(k-m)} h'_m$$

Said content is the same as the equation (4), and preferably, each content of the ROM has 9 bits. Accordingly, the capacity of a ROM of each sub-filter is $9 \times 2^{11}$ bits.

It should be noted that two sub-filters are requested in each operational mode as apparent from the table 2, therefore, two sub-filters are provided for each mode. Further, it should be noted that some pair of sub-filters, like $H_1$ and $H_2$, which provide an output according to the same inputs as each other, are coupled so that those sub-filters are always accessed in parallel.

The reason why each sub-filter has two sub-filter ROMs is as follows. As described above, a conversion process in each sub-filter is carried out for each bit plane of a signal. Accordingly, a time delay relating to n input signal occurs between an input signal and an output signal, where n is the number of quantization bits. When n=9, the conversion process for an input signal will be completed after all the nine bits are applied to the device. During the conversion process, the same sub-filter ROM is of course accessed. When the number of the sub-filters is less than n, each sub-filter is accessed more than twice due to the cyclic use of the sub-filters. The number of the access of a sub-filter in each conversion process is;

$[n/N]+1$ where n is a number of quantization bits of an input signal and an output signal, N is a number of sub-filters, and the symbol [ ] is the Gauss' symbol showing the maximum integer not larger than the argument.

Accordingly, ([n/N]+1) number of sub-filters must be installed. When the number of quantization bits is n=9, and the number of sub-filters is N=6, the necessary number of sub-filter ROMs for each sub-filter is 2.

Figure 6:
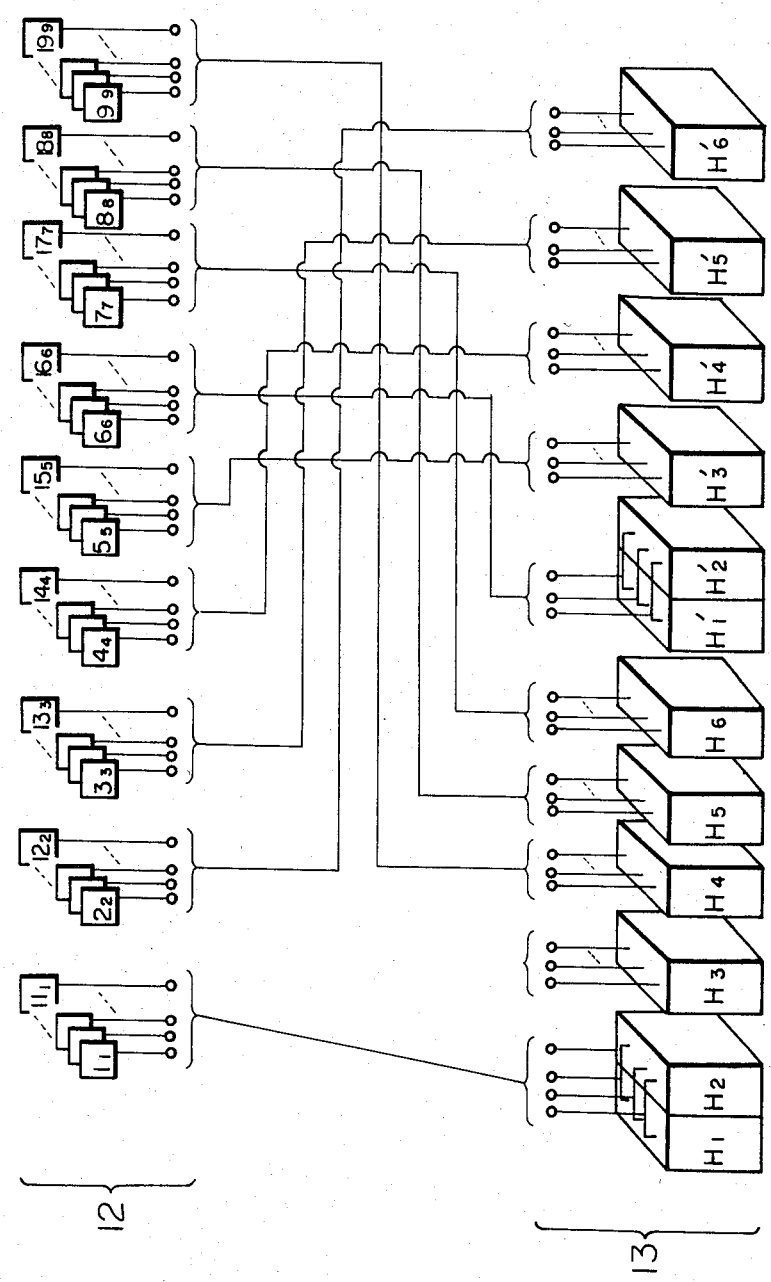
FIG. 6 is the drawing showing the connection between the bit planes and the sub-filter ROMs according to the present invention.

FIG. 6 shows the arrangement of sub-filter ROMs and the wiring connection for the mode (0) in the table 1. In FIG. 6, the numeral 12 is a bit plane obtained from the parallel-serial shift register 7, and 13 shows a sub-filter ROM.

The output of the sub-filter ROM accessed by the address from the bit plane is accumulated in the adder 10 which is provided for each sub-filter ROM. For instance, the shift register adder 1 in the adder group 10 receives the outputs of the sub-filter ROMs 1, which provides the result of the first bit plane (LSB) in the first mode (1), and the result of the second bit plane in the second mode (2). Then, said shift register adder 1 in the group 10 accumulates the outputs of the sub-filter ROMs with the one bit shift of the content of the shift register adder 1. Said one bit shift provides the multiplication by $2^i$ (i=1 through 9) which appears in the equation (4). The completion of each sample is determined according to the table 2, and when the process is completed, the output gate 11 is opened to provide the result to an external circuit. Although it takes delay time of 9 input signals for processing each sample, the process in each sample completes in each change of the mode. Therefore, an output of the sample is obtained for every input sample. That is to say, an output sample is obtained for each access of a sub-filter and an addition (with one bit shift operation).

It should be noted that the output of the output gate 11 provides merely the value of each sample value, but that output gate 11 does not provide the desired speed or repetition of the output pulses. Therefore, the output of the gate 11 is stored in the buffer memory 20 which also receives a clock pulse 22 with the desired output pulse speed. The buffer memory 20 provides the converted output pulse train as shown in FIG. 1(d).

The sequence for reading out the buffer memory 20 is shown in the table 2 and FIG. 6. Assuming that the output of the sub-filter $H_4$ is read out, then, the sequence of the sub-filters to be read out of the buffer memory 20 is $H_4$, $H_5$, $H_6$, $H_{1,2}'$, $H_3'$, $H_4'$, $H_5'$, $H_6'$, $H_{1,2}$, $H_3$ (see bit plane #9 in the table 2 and/or FIG. 6).

Thus, the desired sampling frequency is obtained.

The capacity of the parallel shift register 7 in the present embodiment is 9×19 bits as apparent from FIG. 5, and that capacity of the parallel shift register 7 in general is $(L \times n + n^2)$ bits, where L is the number of taps of a sub-filter, and n is a number of quantization bits.

The total capacity of the sub-filter ROM group 9 in the present embodiment is $2^{11} \times 9 \times 12 = 2^{18}$ The table 3 shows the comparison of the present invention with other systems, in which an input signal with 5 samples/period is converted to an output signal with 6 samples/period (conversion ration is 6/5), the number of taps of an FIR filter is 61, and the number of bits of each input signal, each output signal, and filter coefficient is 9. In the table 3, the systems 1 through 4 for comparison have the following features, respectively.

System (1) All the calculations are carried out as is, without simplifying the calculation.

System (2) All the calculation results are stored in the memories. The necessary addresses of said memories for the total number of the input bits (=99=11×9) are $2^{99}$.

System (3) All the calculations are carried out for every sample through a bit plane process. The necessary number of memories is 54 each having $2^{11}$ addresses, for the addresses of an input signal with 11 data bits.

System (4) Present invention. The 12 number of $2^{11}$ addresses are necessary for the 11 input data bits. Therefore, the total bits as requested are $2^{11} \times 12 \times 9 = 2^{18}$.

TABLE 3

| System | Memory Capacity | Number of Multiplications | Number of Additions |
| --- | --- | --- | --- |
| 1 | 0 | 11(9bits × 9bits) | 10(9bits + 9bits) |
| 2 | $9 \times 2^{99}$ bits | 0 | 0 |
| 3 | $2^{20}$ bits | 0 | 4(9bits + 9bits) (Parallel process) |
| 4 | $2^{18}$ bits | 0 | 1(9bits + 9bits) |

Finally, some effects of the present invention are listed below.

(1) The high speed calculation is accomplished since the multiplication in each tap coefficient is acccomplished by a ROM.

(2) The capacity of a ROM may be reduced by omitting the calculation for an interpolated signal with the amplitude 0 interpolated between input signals.

(3) The process time is shortened since all the ROM provided for each bit of the input signal operate simultaneously.

(4) The reduction of the capacity of a ROM and the high speed calculation are accomplished by using a shift register adder which addes the outputs of the ROM with an single addition.

From the foregoing, it will now be apparent that a new and improved sampling frequency conversion device has been found. It should be understood of course that the embodiments disclosed are merely illustrative and are not intended to limit the scope of the invention. Reference should be made to the appended claims, therefore, rather than the specification as indicating the scope of the invention.

What is claimed is:

1. A sampling frequency conversion device for converting an input digital signal with a sampling frequency (M samples/second) and each sample having n quantization bits, to an output digital signal with sampling frequency (N samples/second) and each sample having n quantization bits, where M and N are prime numbers, comprising;
  (a) parallel shift registers each having bit length P+n, where P is an odd number equal to or larger than M, for accepting an input signal which has n bits, according to a timing of an input signal;
  (b) an address converter for providing P bits of output signal for each of said parallel shift registers for every shift operation of said shift registers;
  (c) N groups of ROMs storing $$\sum_{m=1}^{m} a_i^{(k-m)} h'_m (1 \leq i \leq N)$$

at an address designated by the output of said address converter, each group of said ROMs having $[n/N]+1$ number of ROMs, where K is an integer designating a sampling point, m is an integer designating a filter coefficient, $h_m$ is a coefficient of a filter, $a_i$ is a possible combination of addresses provided by P bits, and [ ] is a Gauss' symbol;

(d) a shift register adder with the bit length 2n for providing an accumulation of the output of said ROMs with shift operation; and (e) an output gate coupled with an output of said shift register adder for providing a converted output signal;

(f) a buffer memory for storing output of said output gate and providing converted sampled pulses with desired repetition frequency.

2. A sampling frequency conversion device according to claim 1, wherein M=5, N=6, and n=9.

* * * * *